US008399338B2

(12) United States Patent
Saito et al.

(10) Patent No.: US 8,399,338 B2
(45) Date of Patent: Mar. 19, 2013

(54) ELECTRONIC COMPONENT MANUFACTURING METHOD

(75) Inventors: Takeshi Saito, Gunma (JP); Tomomichi Takatsu, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 15 days.

(21) Appl. No.: 13/130,076

(22) PCT Filed: Nov. 11, 2009

(86) PCT No.: PCT/JP2009/069207
§ 371 (c)(1),
(2), (4) Date: Jun. 2, 2011

(87) PCT Pub. No.: WO2010/058727
PCT Pub. Date: May 27, 2010

(65) Prior Publication Data
US 2011/0223743 A1    Sep. 15, 2011

(30) Foreign Application Priority Data
Nov. 19, 2008    (JP) ................................. 2008-295633

(51) Int. Cl.
H01L 21/78    (2006.01)
(52) U.S. Cl. ............................... 438/460; 257/E21.599
(58) Field of Classification Search .................. 438/460; 257/E21.599
See application file for complete search history.

(56) References Cited

U.S. PATENT DOCUMENTS

| 7,485,494 | B2 * | 2/2009 | Kang et al. | 438/113 |
| 2009/0230568 | A1 * | 9/2009 | Yasuda et al. | 257/787 |
| 2010/0190293 | A1 * | 7/2010 | Maeda et al. | 438/108 |
| 2010/0330745 | A1 * | 12/2010 | Oikawa et al. | 438/118 |
| 2011/0018127 | A1 * | 1/2011 | Lee | 257/729 |
| 2011/0189835 | A1 * | 8/2011 | Sugo et al. | 438/464 |

FOREIGN PATENT DOCUMENTS

| JP | 2 248064 | 10/1990 |
| JP | 9 266183 | 10/1997 |
| JP | 2003 142505 | 5/2003 |
| JP | 2004 238464 | 8/2004 |
| JP | 2005 5355 | 1/2005 |
| JP | 2006 49509 | 2/2006 |
| JP | 2006 60095 | 3/2006 |
| JP | 2007 246633 | 9/2007 |
| JP | 2008 1817 | 1/2008 |

* cited by examiner

Primary Examiner — Alexander Ghyka
Assistant Examiner — Stanetta Isaac
(74) Attorney, Agent, or Firm — Oblon, Spivak, McClelland, Maier & Neustadt, L.L.P.

(57) ABSTRACT

The objective is to limit pickup defects when chips with a semi-cured adhesive layer are picked up following dicing by lowering the adhesive strength of an ultraviolet curable adhesive beforehand while improving the cohesive force. Provided is a dicing method for semiconductor wafers with a semi-cured adhesive layer that comprises a process to coat the back surface of semiconductor wafers with a paste-like adhesive and semi-cure the paste-like adhesive in a sheet form using heating or ultraviolet irradiation to form a semi-cured adhesive layer, a gluing process to glue an adhesive sheet, wherein an ultraviolet curable adhesive is laminated on a base film, onto the semi-cured adhesive layer, an ultraviolet irradiation process to apply ultraviolet irradiation to the ultraviolet curable adhesive, and a dicing process to dice the semi-cured adhesive layer glued to the adhesive sheet and the semiconductor wafers.

12 Claims, No Drawings

ELECTRONIC COMPONENT MANUFACTURING METHOD

This application is a 371 of PCT/JP2009/069207 filed Nov. 11, 2009.

TECHNICAL FIELD

The present invention relates to a method of manufacturing electronic components when dicing semiconductor wafers having semi-cured glue layers into chips.

BACKGROUND ART

As methods of manufacturing electronic components, methods comprising a bonding step of bonding an electronic component assembly having a plurality of circuit patterns formed on a wafer or insulating substrate to an adhesive sheet, a cutting/separating (dicing) step of cutting the bonded wafer and electronic component assembly into separate chips, a UV irradiation step of irradiating with UV rays from the adhesive sheet side to reduce the adhesive force of the adhesive layer, a pickup step of picking up the diced chips from the adhesive sheet, and a mounting step of applying glue to the bottom surfaces of the picked up chips and mounting the chips on lead frames or the like by means of the glue are known.

Regarding the cutting step, a method of bonding the wafer or electronic component assembly to an adhesive sheet and further securing the adhesive sheet to a ring frame before cutting and separating (dicing) into separate chips is known.

A method using an adhesive sheet (die attachment film-integrated sheet) having both the function of an adhesive sheet for dicing and a glue for mounting the chip on a lead frame or the like, formed by layering a die attachment film on the adhesive sheet used in a manufacturing method as described above has been proposed (Patent Document 1, Patent Document 2). By using a die attachment film-integrated sheet to manufacture electronic components, the step of applying glue after dicing can be omitted. Die attachment film-integrated sheets excel in thickness control of the glue portion and suppression of excess glue as compared with methods using a glue to bond the chip to a lead frame. Die attachment film-integrated sheets are used in the manufacture of electronic components such as chip size packages, stacked packages and system-in-packages.

There are manufacturing methods in which the step of applying glue after dicing can be omitted by applying a paste-type glue to the semiconductor wafer, then semi-curing in the form of a sheet by heating or UV irradiation, to form a semi-cured glue layer.

However, the trend toward higher integration of semiconductor components has caused chips to become larger and thinner, thereby increasing cases in which difficulty is encountered in chip pickup after dicing. Furthermore, since dicing involves dicing not only of the semiconductor wafer, but also of the semi-cured glue layer and adhesive layer of the adhesive sheet, the semi-cured glue layer and the adhesive layer can become intermixed on the dicing line, so that even if the adhesive force is reduced by irradiation with UV rays after dicing, the ease of separation during pickup can be poor, sometimes resulting in pickup failures.

Patent Document 1: JP 2006-049509 A
Patent Document 2: JP 2007-246633 A

DISCLOSURE OF THE INVENTION

Means for Solving the Problem

The present invention has been developed in view of the above-described circumstances, and has the purpose of offering a semiconductor wafer dicing method enabling easy separation between the adhesive sheet and semi-cured glue layer during pickup, thereby facilitating chip pickup work after dicing.

The present invention offers a dicing method for a semiconductor wafer having a semi-cured glue layer, comprising a step of applying a paste-type glue to a rear surface of a semiconductor wafer, and semi-curing the paste-type glue in the form of a sheet by heating or UV irradiation to form a semi-cured glue layer; a bonding step of bonding an adhesive sheet comprising a UV-curable adhesive layered on a substrate film to the semi-cured glue layer; a UV irradiation step of subjecting the UV-curable adhesive to UV irradiation; and a dicing step of dicing the semiconductor wafer and the semi-cured glue layer bonded to the adhesive sheet.

According to an embodiment of the present invention, the UV-curable adhesive comprises at least a (meth)acrylic acid ester polymer, a urethane acrylate oligomer having at least four vinyl groups, a UV polymerization initiator and a silicone graft polymer. Additionally, according to an embodiment of the present invention, the semi-cured glue layer comprises at least an epoxy resin, a polyimide resin, an acrylic resin, a silicone resin, and the thickness of the semi-cured glue layer is at least 10 μm According to this dicing method, the adhesive force of the UV-curable adhesive is reduced beforehand while increasing the cohesive force, thereby reducing intermixture of the semi-cured glue layer and the UV-curable adhesive layer of the adhesive sheet on the dicing line during pickup of chips having a semi-cured glue layer after dicing. As a result, pickup failures can be avoided.

Additionally, as in conventional methods, it is of course possible to have another UV irradiation step after the dicing step.

MODES FOR CARRYING OUT THE INVENTION

Modes for carrying out the present invention shall be described below.

For the purposes of the present specification, the term "monomer" shall apply to both so-called monomers themselves, and to monomer-based structures. In the present specification, "parts" and "%" are understood to be by mass where not indicated otherwise.

Additionally, in the present specification, "(meth)acryloyl group" refers collectively to acryloyl groups and methacryloyl groups. Compounds including "(meth)" such as "(meth) acrylic acid" also refer collectively to both compounds having "meth" and compounds not having "meth" in their names. The "number of functions" in the urethane acrylate oligomer which is a UV-polymerizable compound refers to the number of vinyl groups per urethane acrylate oligomer molecule.

<UV Irradiation Step>

The light source for the UV rays is not particularly limited, and any that is publicly known may be used. Examples of UV sources include black lights, low pressure mercury lamps, high pressure mercury lamps, ultra-high pressure mercury lamps, metal halide lamps and excimer lamps.

The amount of irradiation by UV rays is not particularly limited, and can be appropriately chosen depending on the design of the UV-curable adhesive, but should generally be at least 5 mJ/cm$^2$ and less than 1000 mJ/cm$^2$. If the amount of irradiation is low, the UV-curable adhesive may be insufficiently cured, reducing the pickup ability, while if the irradiation amount is high, prolonged UV irradiation can reduce the productivity.

<UV-Curable Adhesive Layer>

The UV-curable adhesive may be any type that is conventionally known. The components of the UV-curable adhesive and functions when irradiated with UV rays are such that adhesive force is achieved by a base polymer which is the main agent and cured (the adhesive force reduced) by causing a UV-polymerizable compound having unsaturated bonds to form a three-dimensional mesh structure by means of a UV polymerization initiator receiving the UV rays. In order to improve the pickup ability, the base polymer is preferably a (meth)acrylic acid ester polymer, the UV-polymerizable compound is preferably a urethane acrylate oligomer having at least four vinyl groups, and an UV polymerization initiator and a silicone graft polymer are preferably also included.

Examples of the base polymer include commonly known (meth)acrylic acid ester polymers and rubber-based adhesives.

The (meth)acrylic acid ester polymer is a polymer obtained by polymerizing (meth)acrylic acid ester monomers. Additionally, the (meth)acrylic acid ester polymer may include vinyl compound monomers other than (meth)acrylic acid ester monomers.

Examples of (meth)acrylic acid ester monomers include butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxyethyl (meth)acrylate, ethoxyethyl (meth)acrylate, butoxymethyl (meth)acrylate, ethoxy-n-propyl (meth)acrylate, 2-hydroxyethyl (meth)acrylate, 2-hydroxypropyl (meth)acrylate and 2-hydroxybutyl (meth)acrylate.

As the vinyl compound monomer, those having one or more functions from the group consisting of hydroxyl groups, carboxyl groups, epoxy groups, amido groups, amino groups, methylol groups, sulfonate groups, sulfamate groups and phosphate (phosphite) groups may be favorably used.

Examples of vinyl compound monomers having a hydroxyl group include vinyl alcohols.

Examples of vinyl compound monomers having a carboxyl group include (meth)acrylic acid, crotonic acid, maleic acid, maleic anhydride, itaconic acid, fumaric acid, acrylamide N-glycolic acid and cinnamic acid.

Examples of vinyl compound monomers having an epoxy group include allylglycidyl ether and (meth)acrylic acid glycidyl ether.

Examples of vinyl compound monomers having an amido group include (meth)acrylamide.

Examples of vinyl compound monomers having an amino group include N,N-dimethylaminoethyl (meth)acrylate.

Examples of vinyl compound monomers having a methylol group include N-methylol acrylamide.

The method of producing the (meth)acrylic acid ester polymer may be emulsion polymerization, solution polymerization or the like. When considering the pickup ability, acrylic rubber capable of being produced by emulsion polymerization is preferable.

Examples of rubber-based adhesives include natural rubber, synthetic isoprene rubber, styrene butadiene rubber, styrene-butadiene block copolymer, styrene-isoprene block copolymer, butyl rubber, polyisobutylene, polybutadiene, polyvinyl ether, silicone rubber, polyvinyl isobutyl ether, chloroprene rubber, nitrile rubber, Kraft rubber, recycled rubber, styrene-ethylene-butylene block copolymer, styrene-propylene-butylene block copolymer, styrene-isoprene block copolymer, polyisobytlene-ethylene-propylene copolymer, ethylene vinyl acetate copolymer, polyisobutylene silicone rubber and polyvinylisobutyl ether chloroprene, which may be used singly or in mixture.

The above-mentioned UV-polymerizable compounds refer to low molecular weight compounds having at least two photopolymerizable carbon-carbon double bonds in the molecule capable of forming three-dimensional meshes upon UV irradiation, such as acrylate compounds and urethane acrylate oligomers. Examples of acrylate compounds include trimethylol propane triacrylate tetramethylol methane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, cyanuric acid triethylacrylate and commercially available oligoester acrylates.

As for the urethane acrylate oligomers, they can be obtained by reacting a polyol compound such as a polyester or a polyether with a polyhydric isocyanate compound such as 2,4-trilene diisocyanate, 2,6-trilene diisocyanate, 1,3-xylene diisocyanate, 1,4-xylene diisocyanate, diphenylmethane 4,4-diisocyanate, trimethylhexamethylene diisocyanate, hexamethylene diisocyanate and isophorone diisocyanate to obtain an isocyanate terminated urethane prepolymer, and further reacting with a (meth)acrylate having a hydroxy group, such as 2-hydroxyethyl (meth)acrylate, 2-hydroxypropyl (meth)acrylate, polyethylene glycol (meth)acrylate, pentaerythritol triacrylate, glycidol di(meth)acrylate or dipentaerythritol monohydroxypentaacrylate. The UV and/or radiation polymerizable compound should preferably be a urethane acrylate oligomer having at least 4 vinyl groups.

While the amount of the UV-polymerizable compound is not particularly limited, it should preferably be at least 20 parts by mass and at most 200 parts by mass with respect to 100 parts by mass of the base polymer. If the amount of the UV-polymerizable compound is less than 20 parts by mass, the curing of the UV-curable adhesives may be inadequate after UV irradiation, so that the adhesive sheet and semi-cured glue layer cannot be easily separated, resulting in problems in pickup ability. Additionally, if more than 200 parts by mass are added, the curing of the UV curable adhesive may progress after UV irradiation, causing chips to be released during dicing and leaving residual glue from the reaction, resulting in bonding failures when mounting a die chip to which the semi-cured glue layer has been attached onto a lead frame and heating.

Specific examples of UV polymerization initiators include acetophenone-type UV polymerization initiators such as 4-phenoxydichloroacetophenone,
4-t-butyldichloroacetophenone, diethoxyacetophenone,
2-hydroxy-2-methyl-1-phenylpropane-1-one,
1-(4-isopropylphenyl)-2-hydroxy-2-methylpropane-1-one,
1-(4-dodecylphenyl)-3-hydroxy-2-methylpropane-1-one,
4-(2-hydroxyethoxy)phenyl (2-hydroxy-2-propyl)ketone,
1-hydroxycyclohexylphenylketone and
2-methyl-1-[4-(methylthio)phenyl]-2-morpholinopropane-1, benzoin-type UV polymerization initiators such as benzoin, benzoin methyl ether, benzoin ethyl ether, benzoin isopropyl ether, benzoin isobutyl ether and 2,2-dimethoxy-2-phenylacetophenone, benzophenone-type UV polymerization initiators such as benzophenone, benzoyl benzoate, methyl benzoyl benzoate, 4-phenylbenzophenone, hydroxybenzophenone, 4-benzoyl-4'-methyldiphenyl sulfide and 3,3'-dimethyl-4-methoxybenzophenone, thioxanthone-type UV polymerization initiators such as thioxanthone, 2-chlorothioxanthone, 2-methylthioxhanthone, 2,4-dimethylthioxanthone, isopropylthioxanthone, 2,4-dichlorothioxanthone, 2,4-diethylthioxanthone and 2,4-diisopropylthioxanthone, and special UV polymerization initiators such as α-acyloxime ester, acylphosphine oxide, methylphenyl glyoxylate, benzyl, camphorquinone, dibenzosuberone, 2-ethylanthraquinone and 4'-4''-diethylisophthalophenone.

While the amount of UV polymerization initiator added is not particularly limited, it should preferably be 0.1 to 15 parts by mass with respect to 100 parts by mass of the UV-polymerizable compound. If too little is added, the curing action during UV irradiation may be poor, so that the reduction in adhesive force can be insufficient, whereas if too much is added, the stability to heat or fluorescent lamps can be reduced.

A silicone graft polymer may be added to the UV-curable adhesive as needed in order to improve the pickup ability. By using such a silicone graft polymer, the contact at the interface between the semi-cured glue layer and the UV-curable adhesive can be reduced.

The silicone graft polymer is not particularly limited aside from the fact that it should be polymerized from monomers having a silicone molecular chain terminated by a vinyl group (hereinafter referred to as "silicone macromonomer"), examples of which include homopolymers of silicone macromonomers, and copolymers of silicone macromonomers and other vinyl compounds. The silicone macromonomers should preferably be compounds having silicone molecular chains terminated by vinyl groups such as (meth)acryloyl groups or styryl groups.

As examples of other vinyl compounds, (meth)acrylic monomers having high compatibility with other polymers contained in the adhesive are preferred. This is because the adhesive can be made homogeneous overall by using those having high compatibility.

While the amount of the silicone graft polymer added is not particularly limited, it should preferably be at least 0.1 parts by mass and at most 10 parts by mass with respect to 100 parts by mass of the base polymer. If the amount of the silicone graft polymer is less than 0.1 parts by mass, the adhesive sheet and the semi-cured glue layer may not be able to be easily separated, resulting in problems in the pickup ability of the die chip. Additionally, when contained in excess of 10 parts by mass, the initial adhesive force can be reduced, so that separation from the ring frame may occur during the dicing procedure.

The UV-curable adhesive may include a curing agent as needed in order to appropriately set the initial adhesive force. By using such a curing agent, the cohesive force as an adhesive can be raised, and contamination will not occur during bonding even before UV irradiation (in the non-irradiated state), enabling re-separation.

Examples of curing agents include isocyanates, epoxies, and aziridines, which may be used singly or in mixture. Examples of isocyanates include polyhydric isocyanate compounds such as 2,4-trilene diisocyanate, 2,6-trilene diisocyanate, 1,3-xylene diisocyanate, 1,4-xylene diisocyanate, diphenylmethane 4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, lysine isocyanate, phenylene diisocyanate, trilene diisocyanate, diphenylmethane diisocyanate and cyclohexane diisocyanate.

The UV-curable adhesive is typically formed to a thickness of 5 to 70 μm. If too thick, the curing by UV irradiation may take too much time, and if too thin, the adhesive force cannot be set very high. Commonly known adhesion-providing resins, fillers, anti-ageing agents, softening agents, stabilizers and colorants may be appropriately chosen and added to the adhesive.

<Adhesive Sheet>

The adhesive sheet is produced by applying a UV-curable adhesive onto a substrate film, and consists of the substrate film and a UV-curable adhesive layer deposited on top of the substrate film. The thickness of the substrate film should preferably be at least 30 μm and more preferably at least 60 μm. Additionally, the thickness of the substrate film should preferably be at most 300 μm and more preferably at most 200 μm.

Examples of the material of the substrate film include polyvinyl chloride, polyethylene terephthalate, ethylene-vinyl acetate copolymers, ethylene-acrylic acid-acrylic acid ester films, ethylene-ethyl acrylate copolymers, thermoplastic olefin elastomers, polyethylene, polypropylene, polypropylene-based copolymers, ethylene-acrylic acid copolymers and ionomer resins obtained by crosslinking ethylene-(meth)acrylic acid copolymers, ethylene-(meth)acrylic acid-(meth)acrylic acid ester copolymers and the like with metal ions. The substrate film may be a mixture, copolymer or multilayer film composed of these resins.

Among the above-mentioned materials for the substrate film, ionomer resins are preferably used. Among ionomer resins, those obtained by crosslinking copolymers comprising ethylene units, (meth)acrylic acid units and (meth)acrylic acid alkyl ester units with metal ions such as $Na^+$, $K^+$, $Zn^{2+}$ or the like are preferable for being effective in preventing the generation of whisker-shaped shavings.

Examples of methods for molding the substrate film include calendering, T-die extrusion, inflation and casting.

Examples of methods for forming a UV-curable adhesive layer on the substrate film to form an adhesive sheet include methods of directly applying adhesive on the substrate film using a coater such as a gravure coater, comma coater, bar coater, knife coater or roll coater. The adhesive may be printed on the substrate film by relief printing, intaglio printing, planographic printing, flexo printing, offset printing and screen printing.

<Semi-Cured Glue Layer>

The semi-cured glue layer is formed by applying a paste-type glue to the entirety of the rear surface of the semiconductor wafer, in other words, the surface on which the circuitry is not formed, for bonding to a lead frame or a circuit board, and subjecting to heat or UV irradiation to semi-cure the layer in sheet form, resulting in a semi-cured glue layer.

The material of the semi-cured glue layer may be any commonly used adhesive or glue. Examples of adhesives include epoxies, polyamides, acrylics and polyimides. Examples of glues include acrylics, vinyl acetates, ethylene-vinyl acetate copolymers, ethylene-acrylic acid ester copolymers, polyamides, polyethylenes, polysulfones, epoxies, polyimides, polyamide acids, silicones, phenols, rubber polymers, fluorinated rubber polymers and fluorinated resins, of which polyimides are preferred.

The semi-cured layer may be a mixture, copolymer or laminate of these adhesive or glue components. The semi-cured glue layer may include additives such as curing agents, UV polymerization initiators, anti-static agents and curing promoters as needed.

EXAMPLES

Preparation of Test Materials

The respective test materials for the examples were produced by the following formulations.

The following materials were prepared for the adhesive sheet.

methylmethacrylate and 20 parts by mass of 2-hydroxymethylacrylate (polymerized in-house).

Silicone graft oligomer: Silicone graft oligomer having silicone molecular chains terminated with methacryloyl groups (polymerized in-house).

Curing agent: Trimethylol propane adduct of 1,6-hexamethylene diisocyanate (Nippon Polyurethane Coronate HL (registered trademark)).

The main components in the adhesives corresponding to each test number and their amounts are as shown in Table 1, and in preparing each adhesive, 3 parts by mass of a curing agent were added in addition to the components shown in the table.

TABLE 1

| Test No. | | 1 | 2 | 3 | 4 | 5 | 6 | 7 | 8 | 9 | 10 |
|---|---|---|---|---|---|---|---|---|---|---|---|
| UV-curable Adhesive Layer | Base polymer | 100 | 100 | 100 | 100 | 100 | 100 | 100 | 100 | 100 | 100 |
| | UV-polymerizable compound | A100 | A100 | A100 | A100 | A100 | A100 | A20 | A200 | A10 | A300 |
| | UV polymerization initiator | 5 | 5 | 5 | 5 | 5 | 5 | 1 | 10 | 0.5 | 15 |
| | Silicone graft polymer | 2 | 2 | 2 | 2 | 2 | 2 | 2 | 2 | 2 | 2 |
| UV irradiation | Light quantity (mJ/cm$^2$) | 150 | 5 | 1000 | 1 | 1500 | 0 | 150 | 150 | 150 | 150 |
| Semi-cured glue layer | | A | A | A | A | A | A | A | A | A | A |
| Evaluation | Chip retention | A | A | A | A | B | A | A | A | B | B |
| | Pickup ability | A | A | A | B | A | C | A | A | B | A |
| | Dicing ability | A | A | A | B | A | C | A | A | B | A |
| | Overall | A | A | A | B | B | C | A | A | B | B |
| Note | | EX | EX | EX | EX | EX | CE | EX | EX | EX | EX |
| Test No. | | 11 | 12 | 13 | 14 | 15 | 16 | 17 | 18 | 19 | 20 |
| UV-curable Adhesive Layer | Base polymer | 100 | 100 | 100 | 100 | 100 | 100 | 100 | 100 | 100 | 100 |
| | UV-polymerizable cmpd. | A100 | A100 | A100 | A100 | A100 | A100 | A100 | A200 | B100 | A100 |
| | UV polymerization initiator | 0.1 | 15 | 0.05 | 20 | 5 | 5 | 5 | 5 | 5 | 5 |
| | Silicone graft polymer | 2 | 2 | 2 | 2 | 0.1 | 10 | 0.01 | 15 | 0 | 2 |
| UV irradiation | Light quantity (mJ/cm$^2$) | 150 | 150 | 150 | 150 | 150 | 150 | 150 | 150 | 150 | 150 |
| Semi-cured glue layer | | A | A | A | A | A | A | A | A | A | B |
| Evaluation | Chip retention | A | A | A | B | A | A | A | B | A | A |
| | Pickup ability | A | A | B | A | A | A | B | A | B | A |
| | Dicing ability | A | A | B | B | A | A | B | A | B | A |
| | Overall | A | A | B | B | A | A | B | B | B | A |
| Note | | EX | EX | EX | EX | EX | EX | EX | EX | EX | EX |

EX = Example,
CE = Comparative Example

Base polymer: (Meth)acrylic acid ester polymer (polymerized in-house) obtained by suspension polymerization of a copolymer of 54% ethylacrylate, 22% butylacrylate and 24% methoxyethylacrylate.

UV-curable compound A: An acrylate-terminated oligomer obtained by reacting a hexamethylene diisocyanate (aliphatic diisocyanate) trimer to the end of a poly(propylene oxide)diol to obtain an isocyanate-terminated oligomer, then further reacting with dipentaerythritol pentaacrylate. An urethane acrylate oligomer of number-average molecular weight (Mn) 3,700 and 15 acrylate functional groups (15 functions) (polymerized in-house).

UV-polymerizable compound B: Pentaerythritol pentaacrylate (Shin-Nakamura Chemical NK ester A-TMM-3L)

UV-polymerization initiator: Benzyldimethylketal (Ciba Japan Irgacure 651 (registered trademark))

Silicone graft polymer: Silicone graft polymer obtained by polymerizing 30 parts by mass of silicone graft oligomer, 20 parts by mass of butylacrylate, 30 parts by mass of Next, each adhesive was applied to a PET separator film, such that the thickness of the adhesive layer after drying was 10 μm, and this was layered over a substrate film to form an adhesive sheet. The substrate film was a film consisting of an ionomer resin based on Zn salts of an ethylene-methacrylic acid-methacrylic acid alkyl ester copolymer, having a melt flow rate (MFR) of 1.5 g/10 min (JIS K7210, 210° C.) and a melting point of 96° C., and containing $Zn^{2+}$ ions (Mitsui DuPont Polychemicals Himilan 1650 (registered trademark)).

As the semi-cured glue layers, the following were used.

Semi-cured glue layer A: An epoxy glue was used as the paste-type glue, applied to the entire rear surface of a semiconductor wafer of diameter 8 inches and thickness 0.1 mm, then heated for three minutes at 110° C. to result in a 30 μm sheet.

Semi-cured glue layer B: As the paste-type glue, an acrylic resin, and a glue containing epoxy resin was used, applied to the entire rear surface of a semiconductor wafer of diameter 8 inches and thickness 0.1 mm, then irradiated with 1000 mJ/cm$^2$ of UV rays from a high-pressure mercury lamp in a nitrogen atmosphere to result in a 30 μm sheet.

<Bonding Step>

A Technovision FM-3343 was used to bond an adhesive sheet to a semi-cured glue layer formed on the rear surface of a semiconductor wafer.

<UV Irradiation Step>

Test samples from the above bonding step were irradiated from the adhesive sheet side with 150 mJ/cm$^2$ of UV rays from a high-pressure mercury lamp.

<Dicing Step>

The amount of cutting into the adhesive sheet was set to 25 μm. Dicing was performed to a chip size of 10 mm×10 mm. The dicing apparatus was a Disco DAD341. The dicing blade was a Disco NBC-ZH2050-27HEEE.

Dicing blade shape: Outer diameter 55.56 mm, blade width 35 μm, inner diameter 19.05 mm
Dicing blade rotation speed: 40,000 rpm
Dicing blade advancement speed: 50 mm/sec
Cutting water temperature: 25° C.
Cutting water quantity: 1.0 L/min <Pickup Step>

A Canon Machinery CAP-300II was used as the pickup apparatus.
Number of needle pins: 5
Height of needle pins: 0.3 mm
Expansion: 4 mm <Evaluation of Test Results>

Chip retention: The number of chips with semi-cured glue layers retained on the adhesive sheet when dicing a semiconductor wafer under the above conditions was evaluated.
A (excellent): At least 95% of chips retained on adhesive sheet.
B (good): At least 90% and less than 95% of chips retained on adhesive sheet.
C (fail): Less than 90% of chips retained on adhesive sheet.
Pickup ability: After dicing the semiconductor wafer under the above conditions, the number of chips that were able to be picked up with the semi-cured glue layer attached was evaluated.
A (excellent): At least 95% of chips picked up.
B (good): At least 80% and less than 95% of chips picked up.
C (fail): Less than 80% of chips picked up.
Dicing ability: After picking up the chips with the semi-cured glue layer attached, 20 lines of the adhesive sheet dicing lines were observed by microscope at 300 times magnification, to evaluate the adhesive sheets for the presence or absence of residues from the semi-cured glue layer.
A (excellent): No semi-cured glue layer residues.
B (good): Semi-cured glue layer residues present on at least 10% of dicing line.
C (fail): Semi-cured glue layer residues present on at least 50% of dicing line.

As can be seen from the results in Table 1, UV irradiation was not performed in the test for Comparative Example 6, so it exhibited poor pickup ability and dicing ability. In contrast, the examples according to the present invention gave good results in the evaluations of the respective properties when dicing.

The dicing method of the present invention enables the adhesive force of the UV-curable adhesive to be lowered beforehand while increasing the cohesive force, thereby preventing pickup failures when picking up chips with semi-cured glue layers attached after dicing.

The invention claimed is:

1. A dicing method for a semiconductor wafer comprising a semi-cured glue layer, comprising:
    applying a paste-type glue to a rear surface of a semiconductor wafer, and semi-curing said paste-type glue in the form of a sheet by heating or UV irradiation to form a semi-cured glue layer;
    bonding an adhesive sheet comprising a UV-curable adhesive layered on a substrate film to said semi-cured glue layer;
    subjecting said UV-curable adhesive to UV irradiation; and
    dicing said semiconductor wafer and said semi-cured glue layer bonded to said adhesive sheet,
    wherein said UV-curable adhesive comprises at least a (meth)acrylic acid ester polymer, a urethane acrylate oligomer having at least four vinyl groups, a UV polymerization initiator and a silicone graft polymer.

2. A dicing method in accordance with claim 1, wherein said semi-cured glue layer comprises at least an epoxy resin, a polyimide resin, an acrylic resin, a silicone resin, and the thickness of said semi-cured glue layer is at least 10 μm.

3. A dicing method in accordance with claim 2, comprising curing said paste-type glue in the form of a sheet by heating to form said semi-cured glue layer.

4. A dicing method in accordance with claim 2, comprising curing said paste-type glue in the form of a sheet by UV irradiation to form said semi-cured glue layer.

5. A dicing method in accordance with claim 2, wherein said UV-curable adhesive has a thickness of 5-70 μm.

6. A dicing method in accordance with claim 5, wherein said substrate film has a thickness of 30-300 μm.

7. A dicing method in accordance with claim 2, wherein said substrate film has a thickness of 30-300 μm.

8. A dicing method in accordance with claim 1, comprising curing said paste-type glue in the form of a sheet by heating to form said semi-cured glue layer.

9. A dicing method in accordance with claim 1, comprising curing said paste-type glue in the form of a sheet by UV irradiation to form said semi-cured glue layer.

10. A dicing method in accordance with claim 1, wherein said UV-curable adhesive has a thickness of 5-70 μm.

11. A dicing method in accordance with claim 10, wherein said substrate film has a thickness of 30-300 μm.

12. A dicing method in accordance with claim 1, wherein said substrate film has a thickness of 30-300 μm.

* * * * *